(12) United States Patent
Zhou

(10) Patent No.: US 10,199,108 B2
(45) Date of Patent: Feb. 5, 2019

(54) METHODS FOR READ RETRIES AND APPARATUSES USING THE SAME

(71) Applicant: Shannon Systems Ltd., Yangpu, Shanghai (CN)

(72) Inventor: Zhen Zhou, Shanghai (CN)

(73) Assignee: SHANNON SYSTEMS LTD., Yangpu, Shanghai (CN)

( * ) Notice: Subject to any disclaimer, the term of this patent is extended or adjusted under 35 U.S.C. 154(b) by 0 days.

(21) Appl. No.: 15/286,829

(22) Filed: Oct. 6, 2016

(65) Prior Publication Data

US 2018/0068734 A1   Mar. 8, 2018

(30) Foreign Application Priority Data

Sep. 5, 2016 (CN) .......................... 2016 1 0801448

(51) Int. Cl.
| | | |
|---|---|---|
| G06F 11/00 | (2006.01) | |
| G11C 16/26 | (2006.01) | |
| G06F 9/4401 | (2018.01) | |
| G06F 11/10 | (2006.01) | |
| G06F 11/14 | (2006.01) | |
| G11C 16/20 | (2006.01) | |
| G11C 29/52 | (2006.01) | |
| G11C 29/04 | (2006.01) | |

(52) U.S. Cl.
CPC ............ *G11C 16/26* (2013.01); *G06F 9/4401* (2013.01); *G06F 11/1068* (2013.01); *G06F 11/1417* (2013.01); *G11C 16/20* (2013.01); *G11C 29/52* (2013.01); *G11C 2029/0411* (2013.01)

(58) Field of Classification Search
CPC ....... G11C 16/26; G11C 29/52; G06F 9/4401; G06F 11/1068; G06F 11/1417
See application file for complete search history.

(56) References Cited

U.S. PATENT DOCUMENTS

| | | | | | |
|---|---|---|---|---|---|
| 5,483,641 | A | * | 1/1996 | Jones | .................... G06F 3/0601 710/3 |
| 5,721,816 | A | * | 2/1998 | Kusbel | .................. G11B 20/18 360/53 |
| 5,974,544 | A | * | 10/1999 | Jeffries | ............... G06F 11/1092 710/10 |
| 6,084,733 | A | * | 7/2000 | Ohzeki | .................. G11B 19/04 360/53 |
| 6,434,087 | B1 | * | 8/2002 | Schell | .............. G11B 11/10506 369/116 |
| 7,454,560 | B2 | * | 11/2008 | Jun | .......................... G11B 5/09 711/112 |
| 8,645,811 | B2 | * | 2/2014 | Sauber | ................ G06F 11/1004 714/48 |
| 9,122,810 | B2 | * | 9/2015 | Hormuth | ........... G06F 15/17331 |
| 9,171,585 | B2 | * | 10/2015 | Rajan | ........................ G11C 7/10 |
| 9,608,670 | B2 | * | 3/2017 | Bui | ..................... G11B 20/1833 |

(Continued)

*Primary Examiner* — Esaw T Abraham
(74) *Attorney, Agent, or Firm* — McClure, Qualey & Rodack, LLP

(57) ABSTRACT

The invention introduces a method for read retries, performed by a processing unit, including at least the following steps: in boot time, generating and storing microcodes of a retry-read operation in an instruction buffer; and after a successful boot, receiving a retry-read command from a host device through a first access interface; and starting a state machine to execute the microcodes of the retry-read operation of the instruction buffer.

18 Claims, 6 Drawing Sheets

(56) References Cited

U.S. PATENT DOCUMENTS

| | | | |
|---|---|---|---|
| 9,773,565 B1* | 9/2017 | Yeh | G11C 16/26 |
| 2004/0078679 A1 | 4/2004 | Cagle et al. | |
| 2007/0089032 A1* | 4/2007 | Alexander | G06F 11/1024 |
| | | | 714/763 |
| 2014/0192583 A1 | 7/2014 | Rajan et al. | |
| 2014/0293696 A1 | 10/2014 | Lin et al. | |
| 2015/0078094 A1 | 3/2015 | Nagashima | |
| 2015/0262677 A1 | 9/2015 | Lin et al. | |
| 2016/0034206 A1 | 2/2016 | Ryan et al. | |

\* cited by examiner

METHODS FOR READ RETRIES AND APPARATUSES USING THE SAME

CROSS REFERENCE TO RELATED APPLICATIONS

This Application claims priority of China Patent Application No. 201610801448.2, filed on Sep. 5, 2016, the entirety of which is incorporated by reference herein.

BACKGROUND

Technical Field

The present invention relates to flash memory, and in particular to methods for read retries and apparatuses using the same.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NOR to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. In reality, the NAND flash device always reads complete pages from the memory cells and writes complete pages to the memory cells. After a page of data is read from the array into a buffer inside the device, the host can access the data bytes or words one by one by serially clocking them out using a strobe signal.

The NAND flash device is made in a relatively small size, and the data retention, read disturbance, or other factors cause data to be difficult to be read out correctly. Read retry is basically a trial-and-error loop, in which a controller attempts to set threshold voltages one by one according to the settings of a predefined data table until error bits can be recovered by an ECC (error check and correction) decoder. The performance is becoming worse, which is a result of frequent read-retries when the NAND flash device is aged and a large number of reads need to undergo a read retry. Accordingly, what is needed are methods for read retries and apparatuses using the same to improve performance.

BRIEF SUMMARY

An embodiment of the invention introduces a method for read retries, performed by a processing unit, including at least the following steps: in boot time, generating and storing microcodes of a retry-read operation in an instruction buffer; and after a successful boot, receiving a retry-read command from a host device through a first access interface; and starting a state machine to execute the microcodes of the retry-read operation of the instruction buffer.

An embodiment of the invention introduces an apparatus for read retries at least containing an instruction buffer; a state machine; and a processing unit. The processing unit is coupled to the instruction buffer and the state machine, and in boot time, generates and stores microcodes of a retry-read operation in the instruction buffer. After a successful boot, the processing unit receives a retry-read command from a host device through a first access interface; and starts the state machine to execute the microcodes of the retry-read operation of the instruction buffer.

A detailed description is given in the following embodiments with reference to the accompanying drawings.

BRIEF DESCRIPTION OF THE DRAWINGS

The present invention can be fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
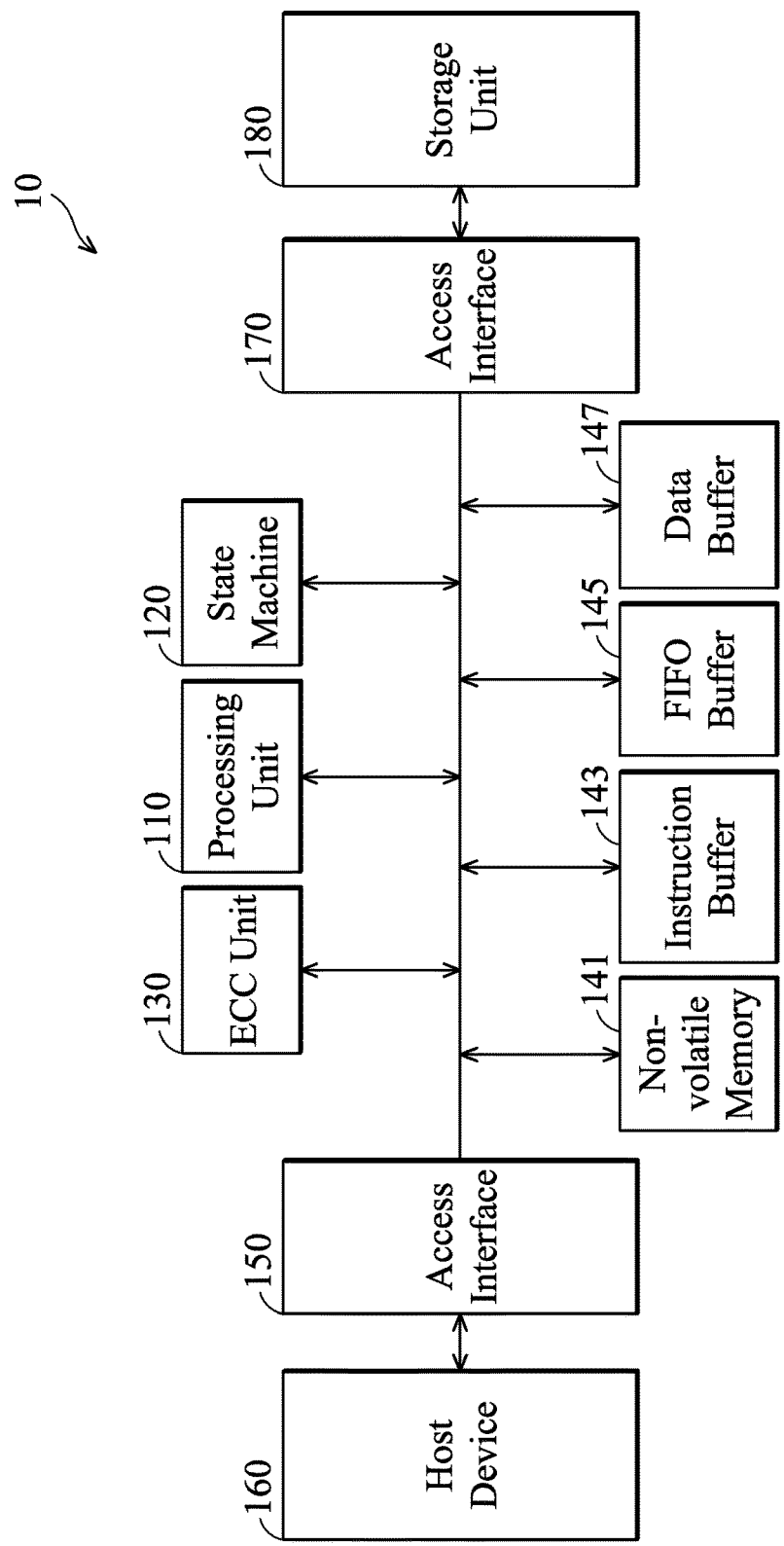
FIG. 1 is the system architecture of a flash memory according to an embodiment of the invention.

FIG. 1 is the system architecture of a flash memory 10 according to an embodiment of the invention. The system architecture of the flash memory 10 contains a processing unit 110 being configured to write data into a designated address of a storage unit 180, and read data from a designated address thereof. Specifically, the processing unit 110 writes data into a designated address of the storage unit 180 through an access interface 170 and reads data from a designated address thereof through the same interface 170. The processing unit 110 may be implemented in numerous ways, such as with dedicated hardware, or with general-purpose hardware (e.g., a single processor, multiple processors or graphics processing units capable of parallel computations, or others) that fetches microcode or software instructions from a FIFO (First-In-First-Out) buffer and is programmed using microcode or software instructions to direct the access interface 170. The system architecture of the flash memory 10 uses several electrical signals for coordinating commands and data transfer between the processing unit 110 and the storage unit 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the storage unit 180 using a SDR (Single Data Rate) protocol or a DDR (Double Data Rate) protocol, such as ONFI (open NAND flash interface), DDR toggle, or others. The processing unit 110 may communicate with other electronic devices through an access interface 150 using a standard protocol, such as USB (Universal Serial Bus), ATA (Advanced Technology Attachment), SATA (Serial ATA), PCI-E (Peripheral Component Interconnect Express) or others.

Figure 2:
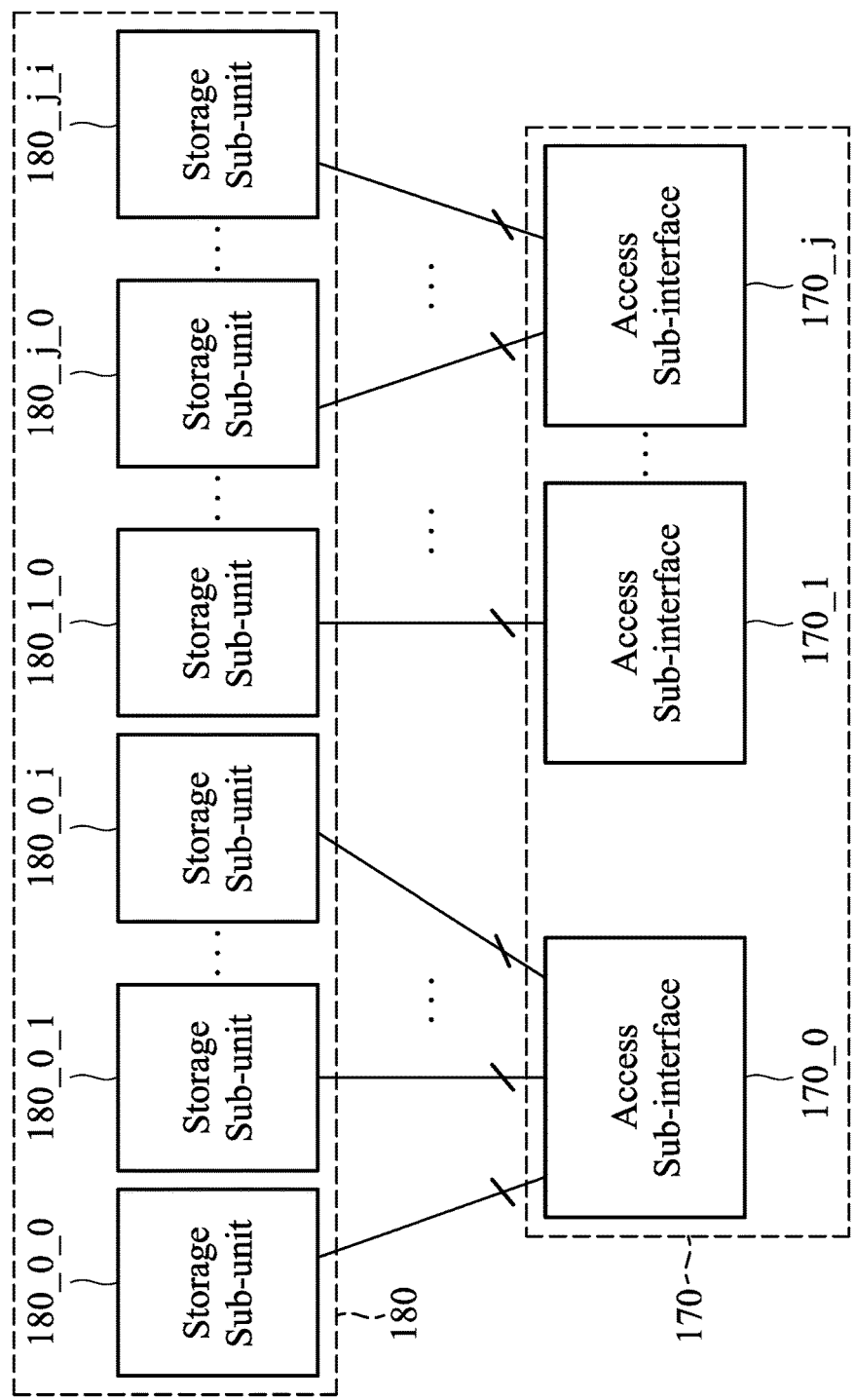
FIG. 2 is a schematic diagram illustrating interfaces to storage units of a flash storage according to an embodiment of the invention.
Figure 3:
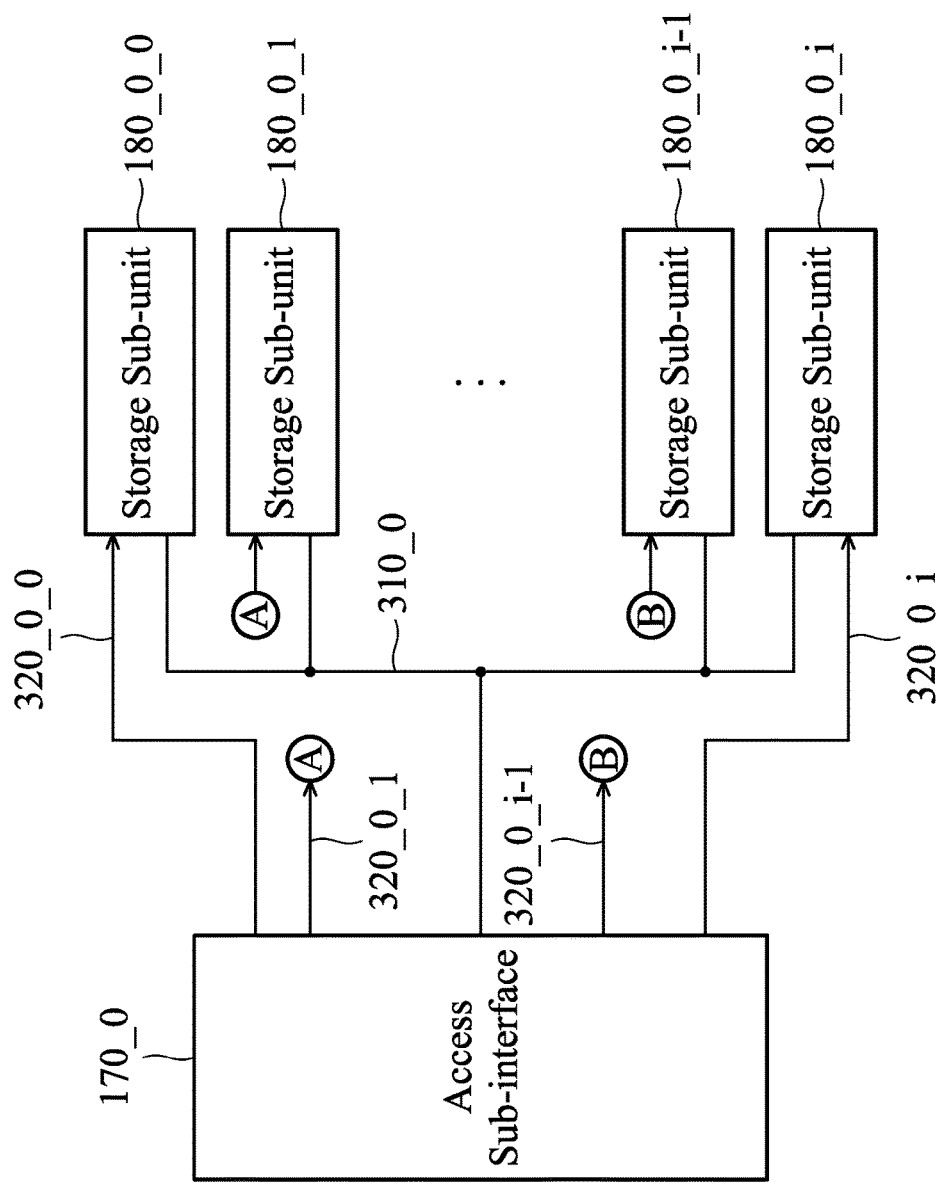
FIG. 3 is a schematic diagram depicting connections between one access sub-interface and multiple storage sub-units according to an embodiment of the invention.

The storage unit 180 may contain multiple storage sub-units and each storage sub-unit may be practiced in a single die and use an access sub-interface to communicate with the processing unit 110. FIG. 2 is a schematic diagram illustrating interfaces to storage units of a flash storage according to an embodiment of the invention. The flash memory 10 may contain j+1 access sub-interfaces 170_0 to 170_j, where the access sub-interfaces may be referred to as channels, and each access sub-interface connects to i−1 storage sub-units. That is, i+1 storage sub-units may share the same access sub-interface. For example, assume that the flash memory contains 4 channels (j=3) and each channel connects to 4 storage sub-units (i=3): The flash memory 10 has 16 storage sub-units 180_0_0 to 180_j_i in total. The processing unit 110 may direct one of the access sub-interfaces 170_0 to 170_j to read data from the designated storage sub-unit. Each storage sub-unit has an independent CE control signal. That is, it is required to enable a corresponding CE control signal when attempting to perform data read from a designated storage sub-unit via an associated access sub-interface. It should be apparent that any number of channels may be provided in the flash memory 10, and each channel may be associated with any number of storage sub-units, and the invention should not be limited thereto. FIG. 3 is a schematic diagram depicting connections between one access sub-interface and multiple storage sub-units according to an embodiment of the invention. The processing unit 110, through the access sub-interface 170_0, may use independent CE control signals 320_0_0 to 320_0_i to select one of the connected storage sub-units 180_0_0 and 180_0_i, and then read data from the designated location of the selected storage sub-unit via the shared data line 310_0.

In an implementation, when receiving a retry-read command from the host device 160 via the access interface 150, the processing unit 110 pushes a retry-read software routine into a FIFO (First-In-First-Out) buffer 145, and then fetches and executes instructions from the FIFO buffer 145 sequentially. The processing unit 110 may contain an ALU (Arithmetic and Logic Unit) and a bit shifter. The ALU is responsible for performing Boolean operations, such as AND, OR, NOT, NAND, NOR, XOR, XNOR, etc., and the bit shifter is responsible for performing bit shift and bit rotation.

Figure 4:
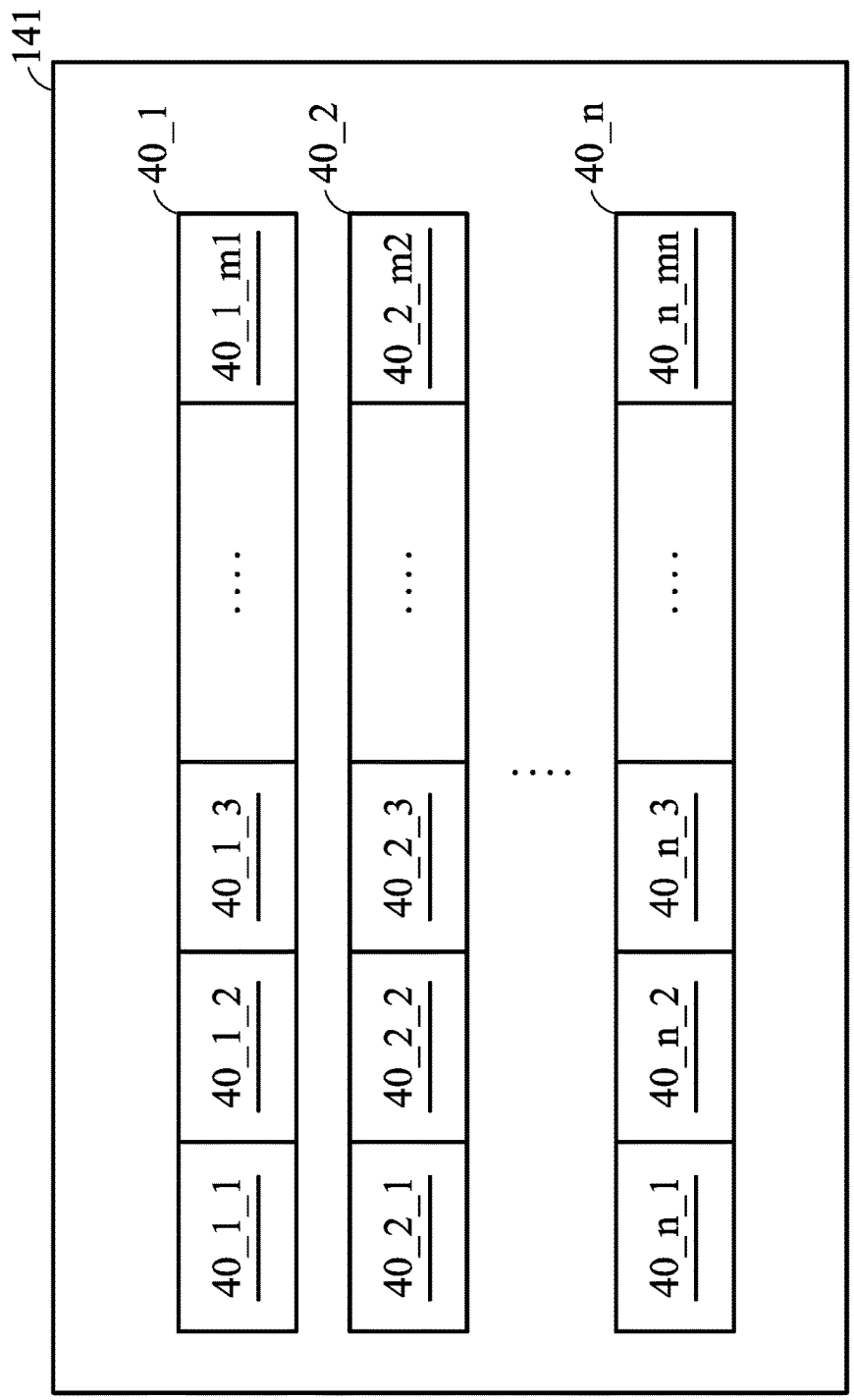
FIG. 4 is a schematic diagram of a storage of retry parameters according to an embodiment of the invention.
Figure 5:
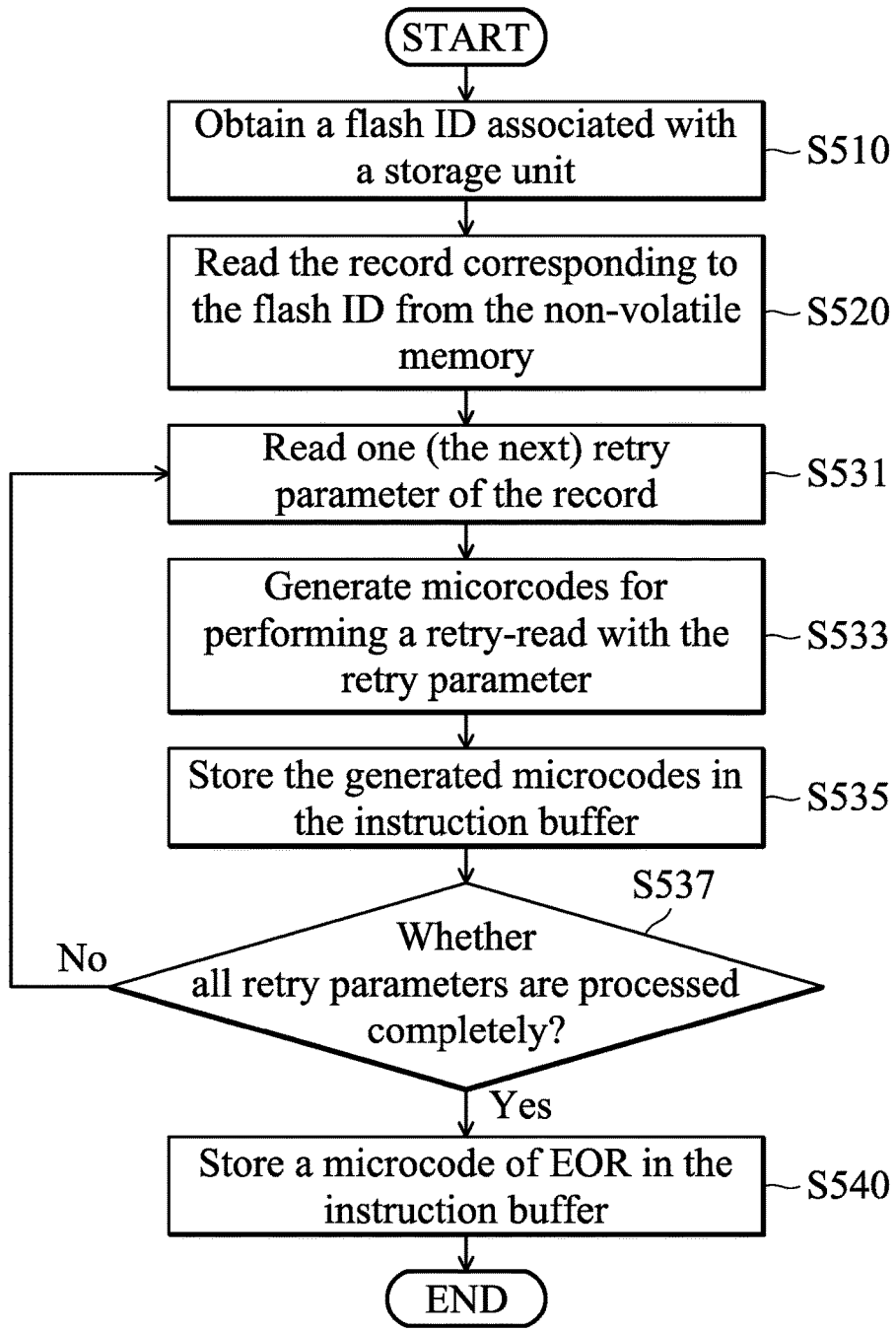
FIG. 5 is a flowchart illustrating a method for generating microcode according to an embodiment of the invention.

Embodiments of the invention introduce a retry-read method to improve the efficiency of the above implementation. Non-volatile memory 141 stores retry parameters for different types of storage units. FIG. 4 is a schematic diagram of a storage of retry parameters according to an embodiment of the invention. Assume that a flash memory device supports n different types of storage units: A non-volatile memory 141 stores records 40_1 to 40_n and each record is associated with a particular type of storage unit and is identified by a flash ID (identifier). Each record contains retry parameters of multiple iterations, each of which contains setting values for directing the access interface 170 to read data. For example, the record 40_1 contains retry parameters 40_1_1 to 40_1_$m1$ of the (m1)-th iteration, the record 40_2 contains retry parameters 40_2_1 to 40_2_$m2$ of the (m2)-th iteration and the record 40_n contains retry parameters 40_n_1 to 40_n_$mn$ of the (mn)-th iteration, where any two of m1 to mn may be the same or different integers. FIG. 5 is a flowchart illustrating a method for generating microcode according to an embodiment of the invention. In boot time, the method is performed for generating and storing microcode of a retry-read operation in an instruction buffer 143 when the processing unit 110 loads and executes a particular software routine. First, the processing unit 110 obtains a flash ID associated with the storage unit 180 (step S510). In an example, the processing unit 110 may query the storage unit 180 via the access interface 170 and obtains the replied flash ID from the storage unit 180. In another example, the flash ID of the storage unit 180 is stored in the non-volatile memory 141 before the flash memory device leaves the manufacturing factory. The processing unit 110 reads the flash ID from the non-volatile memory 141. Subsequently, the processing unit 110 reads the record corresponding to the flash ID from the non-volatile memory 141, such as one of the records 40_1 to 40_n (step S520). Subsequently, the processing unit 110 repeatedly executes a loop for generating retry-read microcodes of multiple iterations (steps S531 to S537). In the loop, specifically, the processing unit 110 reads one retry parameter of the record (step S531), generates microcodes for performing a retry-read with the retry parameter (step S533) and stores the generated microcodes in the instruction buffer 143 (step S535). In step S533, exemplary microcodes are shown in Table 1:

TABLE 1

| Microcode | Description |
| --- | --- |
| Set Param[i] | Set registers for directing an access interface to read data |
| Read | Read data from a storage unit |
| Check_ECC | Inspect if the read data is correct |
| Cond_Jump addr | Conditional jump to the last instruction |

Each microcode may contain an opcode of 2 bytes and an operand of 0 to 8 bytes. The microcode "Set Param[i]" will be executed to set registers to direct the access interface 170 to read data, where the operand "Param[i]" contains the retry parameters read in step S531 of the i-th iteration. The microcode "Read" is generated with no operand and the processing unit 110 when performing the retry-read operation provides a channel number and a physical address for reading data. The microcode "Read" will be executed to direct the access interface 170 to read data from the storage unit 180 according to the channel number and the physical address and stores the replied data in a data buffer 147, which contains ECC (Error Check-and-Correction) code. The microcode "Check_ECC" will be executed to direct an ECC unit 130 to inspect the data of the data buffer 147. The ECC unit 130 uses the ECC code to determine whether one or more errors are occurred in the data. If so, the ECC unit 130 attempts to fix the error bit(s). When the data is correct or the error bit(s) of the data can be fixed, the ECC unit 130 replies with a message indicating that the data is correct. Otherwise, the ECC unit 130 replies with a message indicating that uncorrectable errors have occurred. The processing unit 110 calculates the operand "addr" of microcode "Cond_Jump addr" according to a total number of retry parameters. The microcode "Cond_Jump addr" will be executed to determine the next microcode to execute according to the message from the ECC unit 130. If the message indicates that the data is correct, the microcode at the address "addr" is fetched to execute. If the message indicates that uncorrectable errors have occurred, the microcode at the next address is fetched to execute.

In the last step of the loop, it is determined whether all retry parameters are processed completely (step S537). If not (the "No" path of step S537), it proceeds to the next iteration for reading the next retry parameter (step S531). If so (the "Yes" path of step S537), the loop ends and a microcode of EOR (end of retry-read operation) is stored in the instruction buffer 143 (step S540). In step S540, exemplary microcode is shown in Table 2:

TABLE 2

| Microcode | Description |
| --- | --- |
| Restore | End of retry-read operation |

The microcode "Restore" will be executed to set the registers to default, which are used to direct the access interface 170 to read data, and the processing unit 110 is informed that the retry-read operation ends so as to return the control to the processing unit 110.

Final microcodes stored in the instruction buffer 143 are shown in Table 3:

TABLE 3

Set Param[1]
Read
Check_ECC
Cond_Jump addr
Set Param[2]
Read
Check_ECC
Cond_Jump addr
.
.
.
Set Param[m]
Read
Check_ECC
Cond_Jump addr
Restore m sets of retry-read microcodes "Set Param[i]", "Read", "Check_ECC" and "Cond_Jump addr" are stored in the instruction buffer 143 and the microcode "Restore" is appended to the last set (i.e. the m-th set) of retry-read microcodes at the address "addr".

Figure 6:
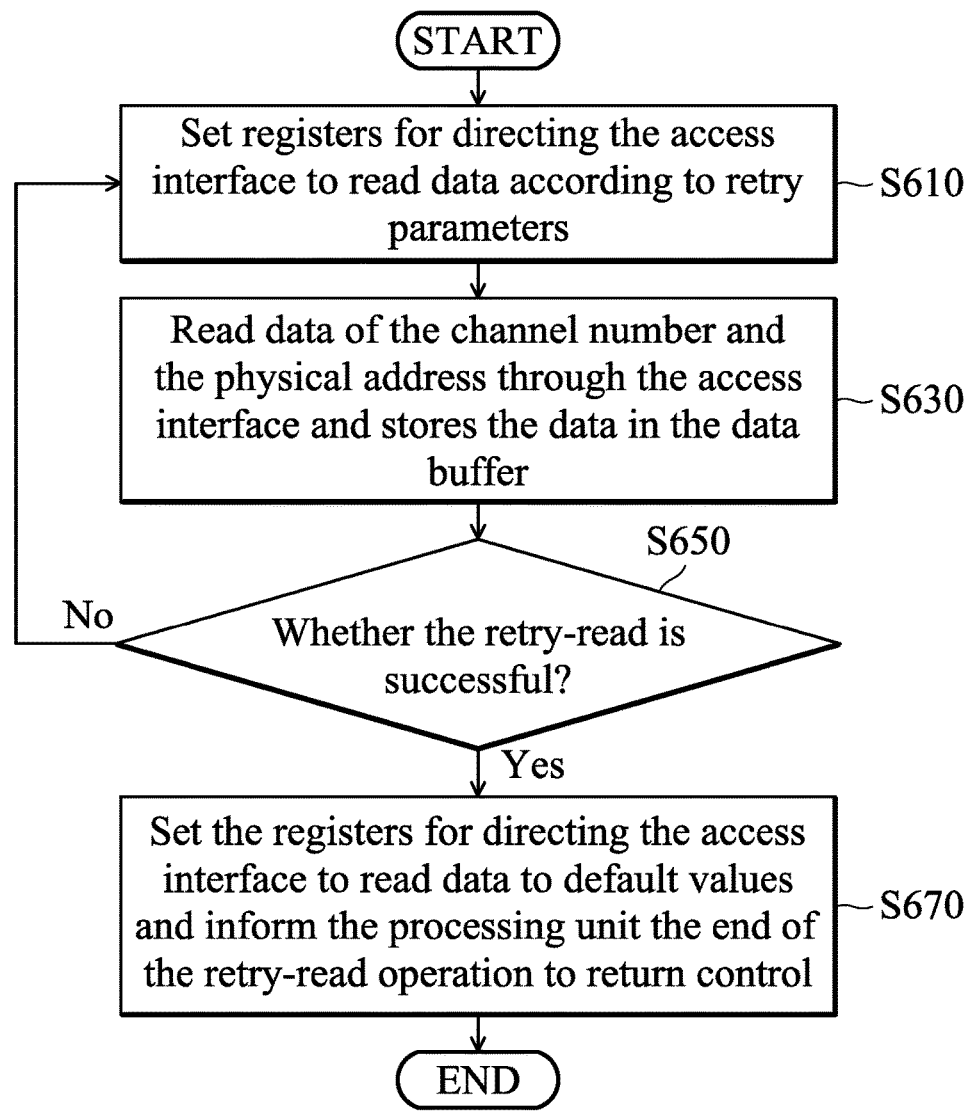
FIG. 6 is a flowchart illustrating a method for read retries according to an embodiment of the invention.

After a successful boot, the system is operated. When receiving a retry-read command from the host device 160 through the access interface 150, the processing unit 110 fetches a special read command from the non-volatile memory 141, which includes the address of the first microcode of the instruction buffer 143. When executing the special read command, the processing unit 110 sends the address of the first microcode of the instruction buffer 143, and a channel number and a physical address of the storage unit 180 to a state machine 120 and starts the state machine 120 to operate. The state machine 120 is particularly designed to execute the microcodes of the instruction buffer 143 to complete the retry-read operation. The state machine 120 consumes less computation resource than that by the processing unit 110. In addition, comparing to the above implementation with the processing unit 110, the state machines 120 fetches microcodes from the instruction buffer 143 sequentially, with no need to move instructions between the non-volatile memory 141 and the FIFO buffer 145. FIG. 6 is a flowchart illustrating a method for read retries according to an embodiment of the invention. The method is performed when the state machine 120 loads and executes the microcodes of the instruction buffer 143. The state machine 120 repeatedly executes a loop (step S610 to S650) until a successful retry-read (the "Yes" path of step S650). In each iteration, the state machine 120 sets registers for directing the access interface 170 to read data according to the retry parameters (step S610), reads data of the channel number and the physical address through the access interface 170 and stores the data in the data buffer 147 (step 630) and directs the ECC unit 130 to determine whether the retry-read is successful (in other words, the data of the data buffer 147 is correct) (step S650). If so (the "Yes" path of step S650), the loop ends. Otherwise (the "No" path of step S650), the process proceeds to the next iteration for setting the retry parameters (step S610). After the loop ends, the state machine 120 sets the registers for directing the access interface 170 to read data to default values and informs the processing unit 110 the end of the retry-read operation to return control (step S670).

Although the embodiment has been described as having specific elements in FIGS. 1 to 3, it should be noted that additional elements may be included to achieve better performance without departing from the spirit of the invention. While the process flow described in FIGS. 5 and 6 include a number of operations or tasks that appear to occur in a specific order, it should be apparent that these processes can include more or fewer operations, which can be executed serially or in parallel (e.g., using parallel processors or a multi-threading environment).

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for read retries, performed by a processing unit, comprising:
   during boot time, generating and storing microcodes of a retry-read operation in an instruction buffer by:
      obtaining a flash ID (identity) associated with a storage unit;
      reading one of a plurality of records, which corresponds to the flash ID, from a non-volatile memory, wherein each record comprises a plurality of retry parameters; and
      generating the retry-read microcodes according to the retry parameters; and
   after a successful boot, receiving a retry-read command from a host device through a first access interface; and starting a state machine to execute the microcodes of the retry-read operation of the instruction buffer.

2. The method of claim 1, wherein the microcodes of the retry-read operation comprises retry-read microcodes of multiple iterations and a microcode of EOR (end of retry-read operation).

3. The method of claim 2, wherein the step of generating and storing microcodes of a retry-read operation in an instruction buffer comprises:
storing the retry-read microcodes in the instruction buffer; and
storing the microcode of EOR in the instruction buffer.

4. The method of claim 3, wherein the records are associated with different types of storage units, and the step of obtaining a flash ID (identity) associated with a storage unit comprises:
querying the storage unit to obtain the flash ID.

5. The method of claim 3, wherein the records are associated with different types of storage units, and the step of obtaining a flash ID (identity) associated with a storage unit comprises:
reading the flash ID from the non-volatile memory.

6. The method of claim 3, wherein the retry-read microcodes of each iteration comprises a first microcode comprising one retry parameter when being executed to set a register to direct a second access interface to read data, a second microcode when being executed to read data through the second access interface and store the data in a data buffer, a third microcode when being executed to direct an ECC (Error Check-and-Correction) unit to inspect the data, and a fourth microcode when being executed to determine whether to fetch and execute the microcode of EOR subsequently according to a replied message from the ECC unit.

7. The method of claim 6, wherein the fourth microcode comprises an address of the microcode of EOR.

8. The method of claim 7, wherein, when the fourth microcode is executed and the replied message indicates that the data is correct, the microcode of EOR is fetched according to the address.

9. The method of claim 8, wherein the microcode of EOR is executed to set the register to a default value and inform the processing unit the end of the retry-read operation to return control.

10. An apparatus for read retries, comprising:
an instruction buffer;
a state machine; and
a processing unit, coupled to the instruction buffer and the state machine, during boot time, generating and storing microcodes of a retry-read operation in the instruction buffer, wherein the processing unit:
obtains a flash ID (identity) associated with a storage unit;
reads one of a plurality of records, which corresponds to the flash ID, from a non-volatile memory, wherein each record comprises a plurality of retry parameters; and
generates the retry-read microcodes according to the retry parameters; and
after a successful boot, receiving a retry-read command from a host device through a first access interface; and
starting the state machine to execute the microcodes of the retry-read operation of the instruction buffer.

11. The apparatus of claim 10, wherein the microcodes of the retry-read operation comprises retry-read microcodes of multiple iterations and a microcode of EOR (end of retry-read operation).

12. The apparatus of claim 11, comprising:
a non-volatile memory,
wherein the processing unit stores the microcode of EOR in the instruction buffer.

13. The apparatus of claim 12, wherein the records are associated with different types of storage units, and the processing unit queries the storage unit to obtain the flash ID.

14. The apparatus of claim 12, wherein the records are associated with different types of storage units, and the processing unit reads the flash ID from the non-volatile memory.

15. The apparatus of claim 12, wherein the retry-read microcodes of each iteration comprises a first microcode comprising one retry parameter when being executed to set a register to direct a second access interface to read data, a second microcode when being executed to read data through the second access interface and store the data in a data buffer, a third microcode when being executed to direct an ECC (Error Check-and-Correction) unit to inspect the data, and a fourth microcode when being executed to determine whether to fetch and execute the microcode of EOR subsequently according to a replied message from the ECC unit.

16. The apparatus of claim 15, wherein the fourth microcode comprises an address of the microcode of EOR.

17. The apparatus of claim 16, wherein, when the fourth microcode is executed and the replied message indicates that the data is correct, the state machine fetches the microcode of EOR according to the address.

18. The apparatus of claim 17, wherein, when executing the microcode of EOR, the state machine sets the register to a default value and informs the processing unit the end of the retry-read operation to return control.

* * * * *